United States Patent [19]

Long et al.

[11] 3,864,642

[45] Feb. 4, 1975

[54] SECOND STAGE OVERLOAD PROTECTION FOR AMPLIFIERS

[75] Inventors: Ernest L. Long, Tempe; Ronald W. Russell, Mesa; James E. Solomon, Scottsdale, all of Ariz.

[73] Assignee: Motorola Inc., Franklin Park, Ill.

[22] Filed: Apr. 13, 1973

[21] Appl. No.: 351,047

Related U.S. Application Data

[63] Continuation of Ser. No. 111,454, Feb. 1, 1971, abandoned.

[52] U.S. Cl. ................. 330/207 P, 330/24, 330/13, 330/26, 330/3

[51] Int. Cl. ............................................ H03f 21/00

[58] Field of Search .............. 330/13, 15, 20, 207 P, 330/24 C; 307/202

[56] References Cited

UNITED STATES PATENTS 3,461,399 8/1969 Houpis et al ...................... 330/26 X

*Primary Examiner*—Nathan Kaufman

*Attorney, Agent, or Firm*—Vincent J. Rauner; Charles R. Hoffman

[57] ABSTRACT

There is disclosed second stage overload protection for amplifiers in which the connection between the second stage and the third stage incorporates a resistive element which is effectively switched to a high value to limit the output current of the second stage whenever a short or a high load occurs at the output of the device. The transistor in the second stage is simultaneously placed in saturation so that it no longer performs an amplification function such that the current drawn when the second stage is in saturation is considerably less than the current drawn when the second stage is in its active region, thus protecting the second stage from current overloading.

7 Claims, 5 Drawing Figures

INVENTOR.
Ernest L. Long
Ronald W. Russell
BY James E. Solomon
Mueller & Aichele
ATTY'S.

INVENTOR.
BY Ernest L. Long
Ronald W. Russell
James E. Solomon
Mueller & Aichele
ATTY'S INVENTOR.
Ernest L. Long
Ronald W. Russell
James E. Solomon
BY
Mueller & Aichele
ATTY'S.

SECOND STAGE OVERLOAD PROTECTION FOR AMPLIFIERS

This is a continuation of application Ser. No. 111,454 filed Feb. 1, 1971, now abandoned.

BACKGROUND

There is disclosed an overload protection circuit for the second stage of an amplifier having three stages and more particularly means for simultaneously limiting the current therefrom and for saturating the second stage in the event that the output in the amplification circuit is shorted to ground.

The amplifier referred to above is in general in the form of an operational amplifier having a first stage, commonly called a gain stage, a second stage which usually incorporates a single transistor and a third or output stage incorporating NPN and PNP transistors in a push-pull arrangement. An operational amplifier is a general purpose amplifier which constitutes a basic building block in many different types of electronic circuits. As a result of the frequent use of the operational amplifier in a variety of circuits, the operational amplifiers are subjected to overloading or accidental shorting which usually results in the destruction of the semiconductor elements used in the amplification circuit if the amplifier is not protected.

Prior art devices have provided adequate overload protection for the third or output stage by providing a diode shunt circuit which shunts the input to the third stage around the active devices in the third stage whenever the current drawn through the third stage reaches a predetermined level or threshold. The diode shunt circuits work reasonably well for the output or third stage because very little amplification of the input signal occurs in the output stage. Providing second stage overload protection presents more of a problem because of the amplification provided by the second stage. If diode shunts are used to protect the second stage from overload, any meaningful protection involves the insertion of a high resistance between the transistor in the second stage and either the positive or the negative supply terminals depending on whether a PNP or an NPN device is used for the second stage. While adequate protection against overload can be obtained by the diode shunt circuit for the second stage, the insertion of the aforementioned high resistance limits the gain of the second stage and results in high second stage dissipation under overload.

Protection of the second stage is provided in the subject circuit by providing that the active element in the second stage go into saturation whenever the third stage is overloaded. This type system obviates the need for shunt circuits which generally degrade operation of the second stage. Thus, from a functional point of view, the second stage operates normally with a high gain whenever normal currents are being drawn from the third stage. However, when the third stage becomes overloaded, the subject circuit simultaneously provides a high resistance between the output of the second stage and ground, and throws the second stage into saturation, therefore reducing the gain of the second stage to a very small value. The current drawn through the second stage is therefore limited by the supply voltage and the resistance in the path between the output of the second stage and ground. It will be appreciated that the current to the second stage is not amplified when the second stage is in saturation. Since there is no current amplification, the second stage is protected from current overload.

SUMMARY OF THE INVENTION it is therefore an object of this invention to provide an improved second stage overload protection circuit for use in operational amplifiers.

It is a further object of this invention to provide overload protection for gain stages in amplifiers in which the active semiconductor elements in the gain stages are made to saturate whenever the circuit is overloaded.

It is a still further object of this invention to provide second stage overload protection for amplifiers in which the second stage of the amplifier is saturated by removing the reverse bias on the active element of the second stage and providing a positive bias therefore.

It is a still further object of this invention to provide second stage overload protection for amplifiers incorporating first, second and third stages by inserting a resistive element between the output of the second stage and the input of that portion of the third stage having an output current in phase with the output current of the second stage such that this resistive element simultaneously provides a high resistance between the output of the second stage and the input to the overloaded stage and causes the second stage to saturate when the current through this element reaches a predetermined threshold.

It is yet another object of this invention to provide a semiconductive resistive element between the second and third stages of an amplification circuit so as to protect the second stage from overload such that the resistive element is activated only when a current is drawn from the circuit exceeding a predetermined threshold whereby the speed and frequency response of the amplification circuit is not deleteriously effected by the insertion of the resistive element during normal operation.

Other objects of the invention will be better understood upon reading the description of the accompanying drawings in which

BRIEF DESCRIPTION OF THE INVENTION

The subject invention centers around the use of a resistive element between the output of the second stage and the input of that portion of the third stage of a three stage operational amplifier having an output current in phase with the output current of the second stage. The purpose of the resistive element is to provide overload protection for the second stage in the event that the output of the third stage is shorted to ground. This protection is provided by effectively providing a low resistance during normal operation of the amplifier and by providing a high resistance between the second stage output and ground whenever the amplifier is overloaded. The high resistance limits the current drawn from the second stage thus protecting it. The result of shorting the output of the circuit to ground is the eventual destruction of the second stage when the first stage starts to drive the second stage hard so as to meet the requirements of the output of the third stage when an accidental grounding occurs if the circuit is not protected. This resistive element may be in one form a simple resistor or in high speed circuits may take the form of a transistor which in normal operation is saturated so as to provide a low resistance between the output of the second stage and the input of the third stage of the amplification circuit. During the normal operation of the amplifier the use of the transistor eliminates parasitic capacitance and loss of speed associated with a high resistive element between the second and third stages. The transistor is placed in its active region whenever the load at the output circuit exceeds a predetermined value. By rendering the transistor into its active region, it operates as a medium to high resistance between the output of the second stage and the input of the aforementioned portion of the third stage. The transistor, in its active region, effectively inserts a high resistance element between the second and third stages thereby limiting the output current of the second stage causing the second stage to go into saturation to protect it from the hard driving of the first stage due to output overload. For purposes of this invention "low resistance" is on the order of hundreds of ohms while "high resistance" refers to resistances above 5 kilohms.

DETAILED DESCRIPTION OF THE INVENTION

Figure 1:
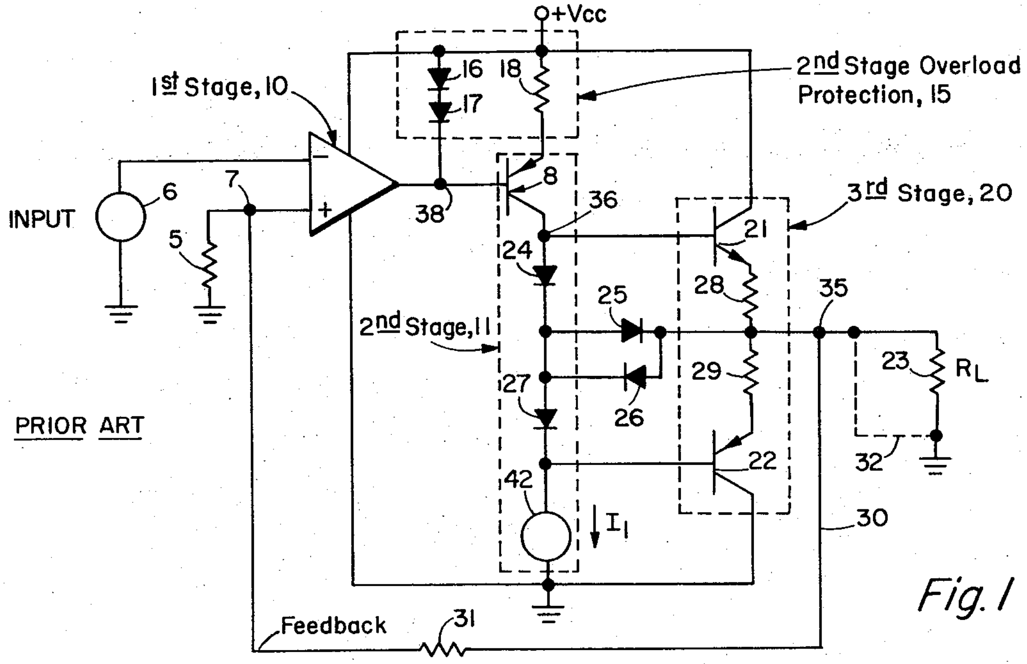
FIG. 1 is a schematic diagram of a prior art method of protecting the second stage of an amplification circuit from overload due to a short between the output of the amplification circuit and ground.

Referring to FIG. 1, a typical three stage amplification circuit, contained in the prior art, is shown comprised of a first stage 10 which is basically a gain block composed of a differential amplifier (not shown) having non-inverting and inverting inputs 7 and 6. The second stage, shown at 11 in FIG. 1, is a supplemental amplification stage composed of a single PNP transistor which is provided with an overload protection circuit 15. This overload protection circuit is composed of a double diode shunt 16 and 17 connected between the positive source of the power supply voltage, $V_{cc}$, and the output of the first stage 10. The second stage overload protection circuit 15 is also provided with a resistive element 18 whose function will be described hereinafter. The output of the second stage is coupled to a third stage 20 or output, which is composed of an NPN transistor 21, a PNP transistor 22 connected in push-pull and biased for class AB output. The output of this circuit is taken between the emitter of these two transistors through a load resistor 23. Overload protection for the third stage is accomplished by the diode shunt circuit composed of diodes 24 through 27 and resistive elements 28 and 29. In one embodiment the diode 24 has a voltage drop equal to that of the base-to-emitter drop across the transistor 21 and the diode 25 has a voltage drop thereacross equal to the IR drop across the resistor 28 so as to permit complete protection of the NPN portion of the push-pull amplifier. A feedback circuit 30 is also shown between the output of the third stage and inverting input 6 to the first stage incorporating a resistive element 31.

If the third stage should accidentally be overloaded or shorted to ground, as shown by a shorting path 32, a large amount of current would be drawn out of a point 35. Pulling current out of the point 35 causes the feedback circuit to increase the signal from the first stage, thus hard driving the second stage. When the increased output current of the third stage reaches a predetermined value, diode 25 is forced into its active region. This shunts the base current of transistor 21 around the transistor through diodes 24 and 25 to ground through the shorted output circuit thus limiting the emitter current of the transistor 21 to a predetermined value. This occurs since it is the property of the diodes that they are rendered conductive whenever voltage thereacross reaches a predetermined level. The increase in voltage from quiescent value is proportional to the current being drawn out of point 35. Diode 26 is coupled between the point 35 and the midpoint between the diodes 24 and 27 for protection of the transistor 22.

With diodes 24 and 25 rendered conductive, an excessive amount of current is drawn out of the node represented by a point 36 which current overload could destroy the second stage were it not protected. When the short 32 occurs between the point 35 and ground, the feedback circuit removes any negative feedback voltage to the first stage such that the first stage input signal is not counteracted by any feedback signal. Since gain stage or first stage of the amplification circuit is usually provided with an extremely high gain, when the input voltage to the first stage is not limited by a feedback signal, the output stage drives the second stage as hard as it can. If the second stage is not placed in saturation the increased base current generated by the first stage is amplified by the beta of the second stage transistor such that the current available at the point 36 becomes excessively high. If overload protection is not provided, the second stage will burn out.

In the prior art, second stage overload protection is provided by the aforementioned diode pair 16 and 17 between the positive power supply source and base of the second stage PNP transistor.

Resistor 18 and the diodes 16 and 17 limit the output current of the second stage in the following manner. When the voltage across the resistor 18 reaches a level that forward biases the diodes 16 and 17, causing them to conduct current, the base current to the second stage PNP transistor is limited to a value such that the sum of the current conducted by the diodes and the base current of the PNP transistor satisfy the current demanded by the first stage output. Since the PNP transistor need not provide all of the current demanded by the first stage output because it is provided through the diodes 16 and 17, the current through the second stage PNP transistor is limited.

A major problem with this circuit, as mentioned before, is the resistance of the resistive element 18. In order to provide adequate overload protection, the resistive element 18 must be of some moderate to high value. If the resistive element 18 is provided with this high value, the gain of the second stage is severely limited. A second major disadvantage is that high, though not destructive, dissipation occurs in the second stage under overload. This is high because the overload current which occurs when the diodes turn on must be chosen significantly higher than the normal operating current of the second stage.

Figure 2:
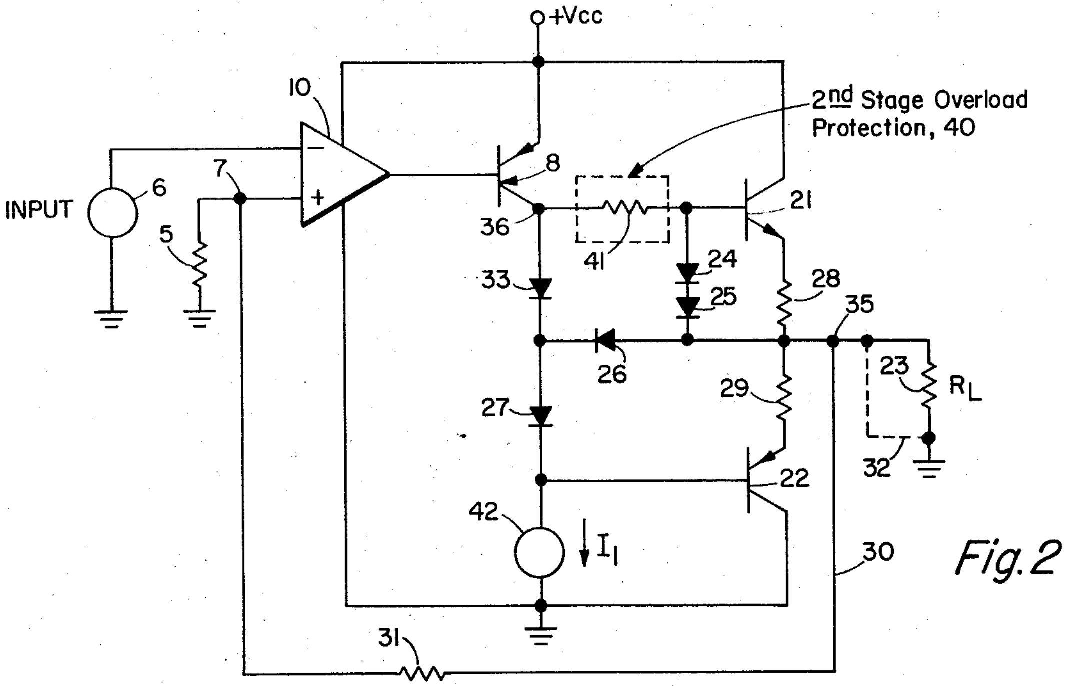
FIG. 2 is a schematic diagram of a three stage amplification circuit in which second stage overload protection is provided by providing a resistive element between the output of the second stage and the input of the third stage.

In this invention overload protection for the second stage is shown in FIG. 2 to be comprised of a resistive element 41, which in itself functions as second stage overload protection denoted by dotted box 40. As mentioned hereinbefore the current at the output of the second stage is to be limited by a high resistance from the output to ground whenever the current drawn out of the point 35 exceeds a predetermined threshold. When this high resistance is inserted the active element 8 of the second stage 11 is saturated. The insertion of the resistor 41 between the collector of active element 8 and the base of the transistor 21 only very slightly effects the output of the amplifying circuit during normal operation because the base current through the resistor is low giving the resistive element 41 an effective resistance of only a couple hundred ohms. However, when an excessive amount of current is drawn out of the node represented by the point 35, the diodes 24 and 25, now placed between resistive element 41 and the point 35, are rendered conductive and the current drawn through resistor 41 is increased. This effectively raises the resistance of element 41 to a high value and raises the voltage at the node represented by the point 36 until active element 8 goes into saturation. This severely reduces the beta of the active element and thus the amplifying capability thereof such that the current now being drawn between the positive power supply terminal, $V_{cc}$, through the second stage active element and ground is divided between the circuit comprising constant current source 42 and diodes 27 and 33 which initially bias active element 8 into conduction, and the circuit comprising resistive element 41, the diodes 24 and 25 and the path 32 to ground. Diode 33 is added to the circuit to set the quiescent current in the push-pull output stage in conjunction with diode 27. As was the prior art case shown in FIG. 1, the diode 26 is placed between the point 35 and the midpoint between the diodes 27 and 33 for the protection of the transistor 22 in conjunction with the diode 27. Typically, the power supply voltage is 15 volts and a 5 kilohm resistor is used as the resistive element 41. Then when device 8 saturates, the current pulled out of the node represented by the point 36 will be on the order of 3 milliamperes when the device 8 is in saturation. It will be appreciated that if a short should develop between the output of the subject circuit and ground, assuming the amplification factor of the device 8 to be 100, then the current pulled out of the node represented by the point 36 could be as high as 100 milliamperes which would destroy the second stage since normal second stage circuits can be destroyed by the drawing of between 20 and 30 milliamperes from the output node. Therefore it is necessary to limit the second stage output current as well as the third stage output current.

While the circuit is described in terms of the NPN portion of the output stage, it will be appreciated that the lower portion of the output stage involving the PNP transistor 22, the diodes 26 and 27 and the resistive element 29, function in precisely the same manner as diodes 24 and 25, and resistive element 28 in combination with transistor 21. In one embodiment, the diode 27 has a voltage drop equal to the base-to-emitter drop of the transistor 22 and the diode 26 has a drop equal to the IR drop across the resistor 29 during overload.

Figure 3:
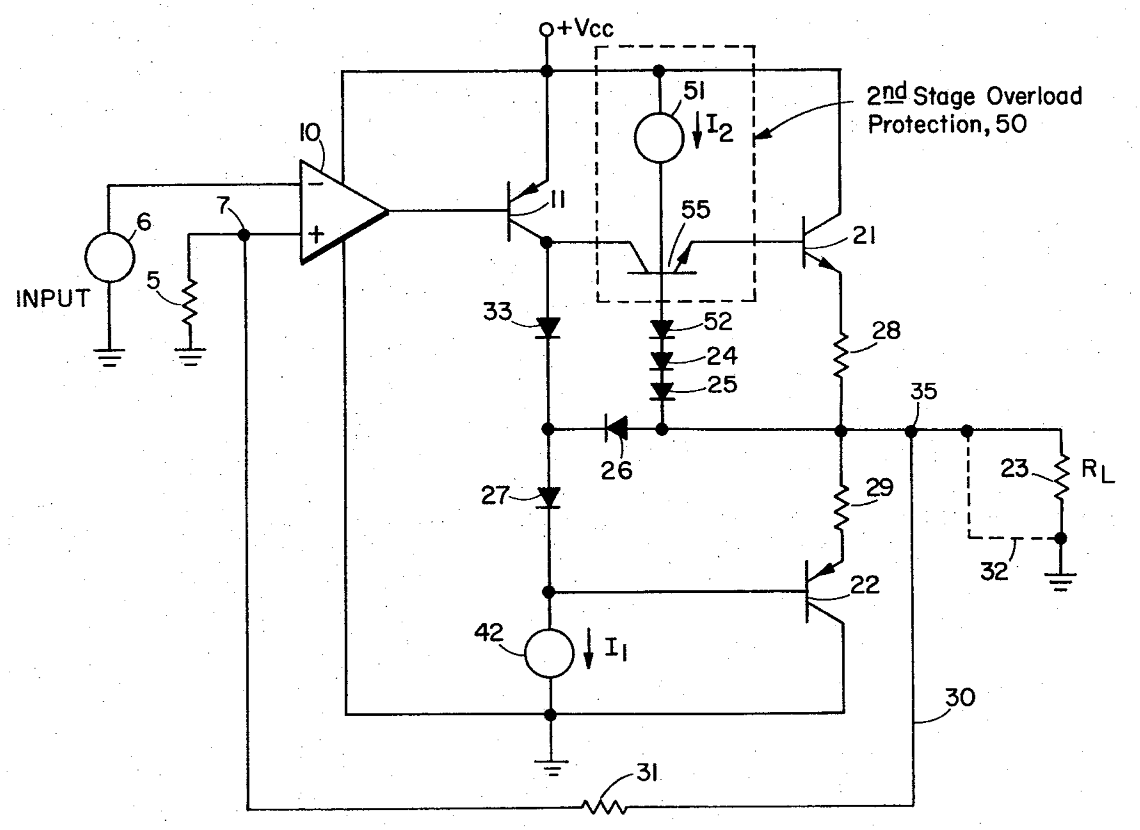
FIG. 3 is a schematic diagram of the three stage amplification circuit shown in FIG. 2 in which the resistive element which provides the second stage overload protection is in the form of a transistor which is maintained in a saturated condition during the normal operation of the amplification circuit and which is placed in its active region whenever an overload condition occurs at the output of the amplification circuit that would cause an increase in the second stage output current such that the transistor performs the same function as the resistive element in FIG. 2 whenever overload occurs.

Referring to FIG. 3, the second stage overload protection 40 comprising a single resistive element 41 has been replaced with a different circuit 50 having a single NPN transistor 55, a second constant current source 51 and an additional diode 52 to compensate for the base-to-emitter voltage drop of the transistor 55. It will be appreciated that in high speed circuits the insertion of the resistive element 41 between the output of the second stage and the input of the third stage has associated with it an RC pole formed by the resistor and parasitic capacitance which slows down the circuit. It is therefore necessary in high speed amplification circuits to provide that the resistance of this element be low and close to zero during the normal operation of the circuit and thereafter rise to an appropriately high value to simultaneously limit the second stage current and saturate the second stage when the short 32 occurs. This is accomplished by the circuit shown in FIG. 3, in which the transistor 55 is saturated in its normal condition by the setting of the current source 51 coupled between the positive supply voltage, $V_{cc}$, and the base of the transistor 55 sufficiently high to saturate the transistor. When the short 32 occurs at the output of the subject circuit, the diodes 52, 24 and 25 are rendered conductive thus counteracting the effect of constant current source 51. This renders the transistor 55 into its active region such that there is a large resistance between the collector and the emitter of this transistor. The transistor 55, when in its active region, serves as the aforementioned resistive element 41, whenever the current source 51 is counteracted. This provides the appropriate resistance only during overload conditions thus eliminating the pole introduced with the insertion of the resistive element 41 in the circuit shown in FIG. 2.

Figure 4:
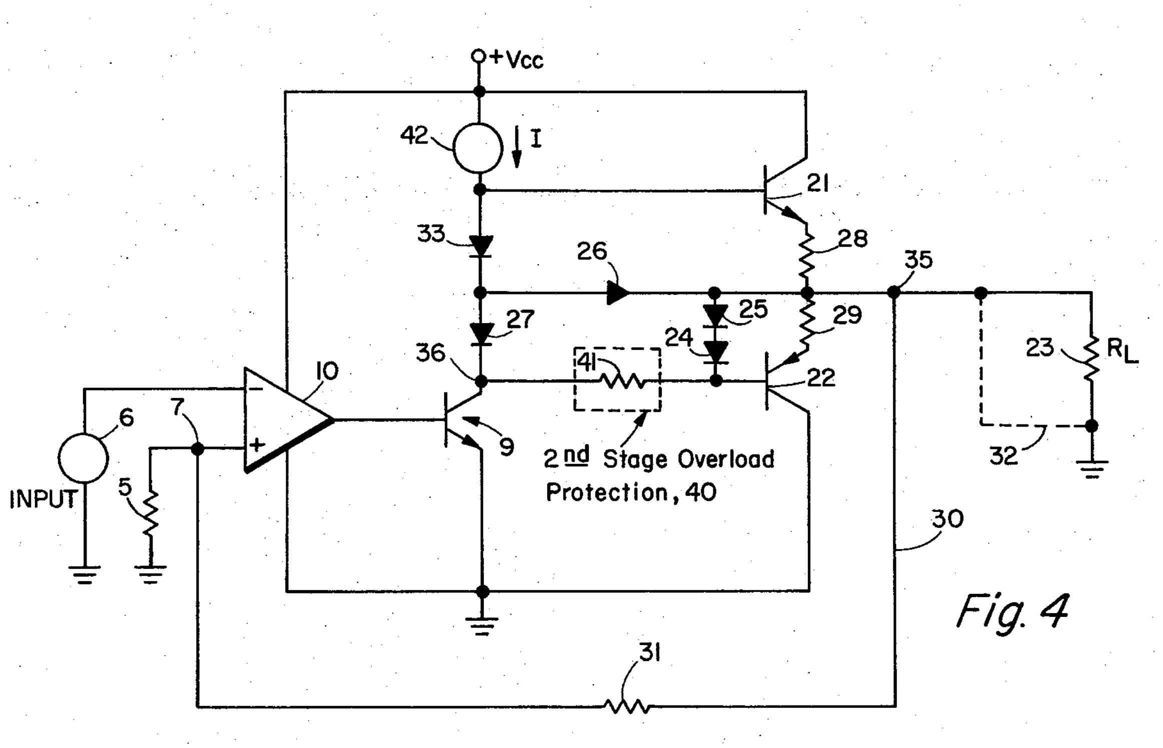
FIGS. 4 and 5 are schematic diagrams showing modification of the second stage overload protection circuits shown in FIGS. 2 and 3 in which the replacement of the PNP second stage transistor with an NPN second stage is indicated.
Figure 5:
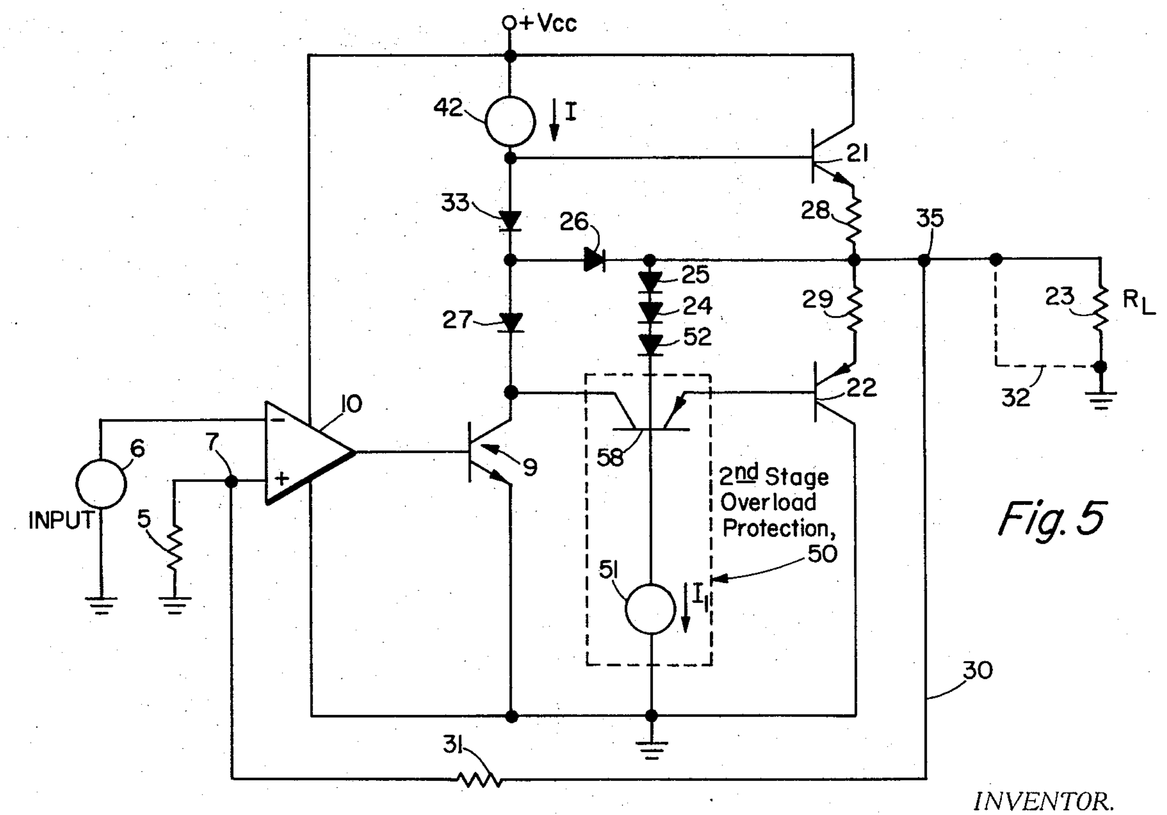

Circuits similar to those shown in FIGS. 2 and 3, are shown in FIGS. 4 and 5 except that an NPN second stage active element 9 is utilized instead of the PNP second stage active element 8, shown in FIG. 2. As such the circuits shown in FIGS. 4 and 5 are analogs of the circuits shown in FIGS. 2 and 3. In FIGS. 4 and 5 like elements are labelled with members corresponding to like elements in FIGS. 2 and 3.

The major change necessary in order to use an NPN second stage is the biasing arrangement for the second stage transistor and the reversing of the input terminals to the push-pull amplifier, with the resistive element being inserted into the base circuit of the PNP transistor 22 rather than the base circuit of the NPN transistor 21. This results in the collector supply circuit being composed of the current source 42, the diode 33 and the diode 27 connected as shown in FIGS. 4 and 5. In FIG. 5 the NPN transistor 55 of FIG. 3 is replaced with a PNP transistor 58 with biasing circuitry running now from the low voltage terminal or ground. It will be appreciated that the diodes 26, 27 and 33 are now shown with polarities reversed from those shown in FIGS. 2 and 3.

Other than the above circuit modifications the circuits shown in FIGS. 4 and 5 operate in the same manner as their counterparts in FIGS. 2 and 3, to saturate the second stage and thereby limit the current therefrom.

It will be appreciated in all of the circuit configurations shown in the figures that the circuits may be described in terms of a gain stage or first stage, a supplemental amplification stage or second stage and an output stage or third stage.

What is claimed is:

1. In an amplifier circuit including a gain stage connected to a supplemental amplification stage, an output stage having an output transistor and an output terminal, said output transistor having a base and an emitter, said amplifier circuit having feedback means coupled between said output stage and said gain stage, said supplemental amplification stage having an input transistor having a collector, an overload protection circuit comprising:

switchable resistive coupling circuit means connected between said collector of said input transistor and said base of said output transistor for switching overload currents in said switchable resistive coupling circuit means to cause a voltage to develop across said switchable resistive coupling circuit means under overload conditions at said output terminal, said voltage being sufficiently large in magnitude to saturate said input transistor.

2. The overload protection circuit is recited in claim 1 wherein said switchable resistive coupling circuit means includes a first resistor connected between said collector and said base, and said output stage includes a second resistor connected between said output terminal and said emitter of said output transistor and said switchable resistive coupling circuit means includes first and second diodes connected in series, the anode of said first diode being connected to said base of said output transistor and the cathode of said second diode being connected to said output terminal.

3. The overload protection circuit as recited in claim 1 wherein said input transistor and said output transistor are NPN transistors.

4. The overload protection circuit as recited in claim 1 wherein said switchable resistive coupling circuit means include a transistor having a second collector, a second emitter, and a second base, said second collector being connected to said collector of said input transistor and said second emitter being connected to said base of said output transistor.

5. In an amplifier circuit having a gain stage coupled to a supplemental amplification stage, said supplemental amplification stage being coupled to an output stage having an output transistor and an output terminal, said amplifier circuit having feedback means connected between said output stage and said gain stage, said supplemental amplification stage having an input transistor coupled to an output of said gain stage, an overload protection circuit, the improvement comprising:

means coupled between said input transistor and said output stage for saturation of said input transistor, said means including a resistive circuit connected between said output stage and an output of said supplemental amplification stage, said resistive circuit comprising a coupling transistor for providing high resistance under output overload conditions and a low saturation resistance under normal operating conditions and a constant current source circuit for saturating said coupling transistor under normal operating conditions, said coupling transistor having a collector electrode connected to a collector electrode of said input transistor and an emitter electrode connected to a base electrode of an output transistor coupled to said output terminal and a base electrode connected to said constant current source and also connected to circuit means responsive to said output terminal for saturating said input transistor when excessive current is drawn from said output terminal, thereby protecting said supplemental amplification stage from damage under overload conditions by limiting the current therein.

6. An amplifier circuit having a gain stage connected to a supplemental amplification stage and an output stage, said output stage being connected to said supplemental amplification stage and having an output terminal, and a second stage overload protection circuit coupled between said gain stage and said output stage, wherein:

said supplemental amplification stage includes a PNP input transistor, a first diode, a second diode, and a first constant current source circuit in series connection between a power supply conductor and ground, said diodes being connected to allow current to flow from said power supply conductor to ground;

said output stage includes an NPN transistor, two emitter resistors, and a PNP transistor in series connection between said power supply and ground, said NPN transistor being connected between said power supply conductor and one of said emitter resistors, said PNP transistor being coupled between ground and the other of said emitter resistors, each of said emitter resistors being coupled between one of said NPN transistor and said PNP transistor and said output terminal and;

said second stage overload protection circuit includes, in combination, a PNP coupling transistor having a collector connected to the collector of said PNP input transistor, an emitter connected to the base of said NPN transistor, and a base connected to a second constant current source circuit, and third, fourth, and fifth diodes connected in series between the base of said NPN coupling transistor and said output terminal, and a sixth diode connected between said output terminal and an output of said supplemental amplification stage, for saturating said PNP input transistor when said output terminal is shorted to ground.

7. An amplifier circuit having a gain stage connected to a supplemental amplification stage and an output stage, said output stage being connected to said supplemental amplification stage and having an output terminal, and a second stage overload protection circuit coupled between said gain stage and said output stage, wherein:

said supplemental amplification stage includes an NPN input transistor, a first diode, a second diode, and a first constant current source circuit in series connection between a power supply conductor and ground, said diodes being connected to allow current to flow from said power supply conductor to ground;

said output stage includes an NPN transistor, two emitter resistors, and a PNP transistor in series connection between said power supply and ground, said NPN transistor being connected between said power supply conductor and one of said emitter resistors, said PNP transistor being coupled between ground and the other of said emitter resistors, each of said emitter resistors being coupled between one of said NPN transistor and said PNP transistor and said output terminal and;

said second stage overload protection circuit includes, in combination, a PNP coupling transistor having a collector connected to the collector of said NPN input transistor, an emitter connected to the base of said PNP transistor, and a base connected to a second constant current source circuit, and third, fourth, and fifth diodes connected in series between the base of said NPN coupling transistor and said output terminal, and a sixth diode connected between said output terminal and an output of said supplemental amplification stage, for saturating said NPN input transistor when said output terminal is shorted to ground.

* * * * *